(12) United States Patent
Jiang (10) Patent No.: US 11,967,757 B2
(45) Date of Patent: Apr. 23, 2024

(54) HELICAL ANTENNA

(71) Applicant: Beijing Unistrong Science & Technology Co., Ltd., Beijing (CN)

(72) Inventor: Juncheng Jiang, Beijing (CN)

(73) Assignee: Beijing Unistrong Science & Technology Co., Ltd., Beijing (CN)

( * ) Notice: Subject to any disclaimer, the term of this patent is extended or adjusted under 35 U.S.C. 154(b) by 902 days.

(21) Appl. No.: 16/978,645

(22) PCT Filed: Nov. 6, 2018

(86) PCT No.: PCT/CN2018/114086
§ 371 (c)(1),
(2) Date: Sep. 4, 2020

(87) PCT Pub. No.: WO2020/062448
PCT Pub. Date: Apr. 2, 2020

(65) Prior Publication Data
US 2020/0411974 A1     Dec. 31, 2020

(30) Foreign Application Priority Data

Sep. 29, 2018   (CN) .......................... 201811152987.3

(51) Int. Cl.
*H01Q 1/36*       (2006.01)
*G01S 19/36*      (2010.01)
(Continued)

(52) U.S. Cl.
CPC ............. *H01Q 1/362* (2013.01); *G01S 19/36* (2013.01); *H01Q 1/50* (2013.01); *H03F 3/19* (2013.01);
(Continued)

(58) Field of Classification Search
CPC ............ H01Q 1/362; H01Q 1/50; H01Q 5/50; H01Q 5/385; H01Q 11/08; H01Q 1/38;
(Continued)

(56) References Cited

U.S. PATENT DOCUMENTS 6,072,441 A  *  6/2000  Tanabe ................... H01Q 11/08
                                                          343/895
6,339,408 B1 *  1/2002  Edvardsson ........... H01Q 1/242
                                                          343/702
(Continued)

FOREIGN PATENT DOCUMENTS

CN       205282639 U     6/2016
CN       106207411 A    12/2016
(Continued)

OTHER PUBLICATIONS

Extended European Search Report for European Application No. 18934569.7, dated May 11, 2022.
(Continued)

*Primary Examiner* — Khai M Nguyen
(74) *Attorney, Agent, or Firm* — Wolf, Greenfield & Sacks, P.C.

(57) ABSTRACT

A helical antenna, including a printed circuit board and a radiating body provided above the printed circuit board. The radiating body includes at least one main helical arm and at least one parasitic helical arm. Each main helical arm corresponds to at least one parasitic helical arm. Each main helical arm is arranged in parallel with and is spaced with its corresponding parasitic helical arm. A first terminal of each main helical arm is electrically connected to a first terminal of the corresponding parasitic helical arm. A second terminal of the main helical arm and a second terminal of the parasitic
(Continued)

helical arm are both in a floating state, and a length of the parasitic helical arm is greater than a length of its corresponding main helical arm.

12 Claims, 6 Drawing Sheets

(51) Int. Cl.
*H01Q 1/50* (2006.01)
*H03F 3/19* (2006.01)
*H05K 1/02* (2006.01)

(52) U.S. Cl.
CPC ..... *H05K 1/0243* (2013.01); *H03F 2200/451* (2013.01); *H05K 2201/10098* (2013.01)

(58) Field of Classification Search
CPC . H01Q 5/10; H01Q 5/20; H01Q 5/378; G01S 19/36; H03F 3/19; H03F 2200/451; H03F 2200/111; H03F 2200/294; H03F 3/68; H05K 1/0243; H05K 2201/10098; H05K 1/165; H05K 1/025; H05K 1/118; H05K 2201/051
USPC ........................................... 343/895
See application file for complete search history.

(56) References Cited

U.S. PATENT DOCUMENTS

| 6,421,028 | B1* | 7/2002 | Ohgren | H01Q 11/08 343/895 |
| 6,421,029 | B1* | 7/2002 | Tanabe | H01Q 5/40 343/702 |
| 9,190,718 | B2 | 11/2015 | DiNallo et al. | |

FOREIGN PATENT DOCUMENTS

| CN | 206506019 U | 9/2017 |
| CN | 207587960 U | 7/2018 |
| EP | 0 917 241 A1 | 5/1999 |
| EP | 0 920 712 A1 | 6/1999 |
| WO | WO 98/05090 A1 | 2/1998 |
| WO | WO 2013/076457 A1 | 5/2013 |
| WO | WO 2018/167353 A1 | 9/2018 |

OTHER PUBLICATIONS

International Search Report and Written Opinion for International Application No. PCT/CN2018/114086, dated Jun. 27, 2019.

* cited by examiner

HELICAL ANTENNA

This application is a national stage filing under 35 U.S.C. § 371 of International Patent Application Serial No. PCT/CN2018/114086, filed Nov. 6, 2018, entitled "SPIRAL ANTENNA", which claims the priority to Chinese Patent Application No. 201811152987.3, titled "HELICAL ANTENNA", filed on Sep. 29, 2018 with the China National Intellectual Property Administration (CNIPA). The contents of these applications are incorporated herein by reference in their entireties.

TECHNICAL FIELD

The present disclosure relates to the field of satellite positioning technology, and in particular to a helical antenna.

BACKGROUND

Generally, a microstrip ceramic or a microwave dielectric patch antenna based on a microstrip patch antenna principle is usually used in the global satellite positioning technology. Such antenna is made of ceramics as a dielectric material to form square or circle antenna patches with different thicknesses, then a reflection surface and a radiation surface are formed respectively on two sides of the antenna patch through a low temperature silver baking process, and next, a satellite navigation antenna is formed by feeding the antenna patch via a feed needle.

However, the satellite navigation antenna described above has many disadvantages. For example, an antenna made of ceramic material has a higher dielectric constant, which results in a narrow frequency bandwidth of the antenna. Moreover, a positioning antenna with such structure has a high requirement on dimensional accuracy of the radiation surface. The gain of the microstrip patch antenna is easily affected by the size and shape of the reflective ground plane, thus it is usually required to perform a manual adjustment on the satellite navigation antenna through a network analyzer, such that the center frequency of the satellite navigation antenna falls within a frequency range that meets the actual requirements. In addition, the ceramic material has a large specific gravity, and the microwave dielectric patch antenna also has a large size, which may result in a large weight of the satellite navigation antenna.

Moreover, in the field of unmanned aerial vehicle, it is the quadrifilar helix antenna proposed by Kilgus at Johns Hopkins University in America that are widely applied currently. The quadrifilar helix antenna is made of four wires each having a length of half a wavelength and each twined in half a circle spiral. In recent years, a double quadrifilar helix antenna including two sets of helix antennas each having a length of a quarter wavelength is also provided, and a tuning bar is added to the double quadrifilar helix antenna to perform frequency separation and matching.

However, the above quadrifilar helix antenna is a resonator antenna, which only has about 4% narrow frequency band, and only can cover GPS/BDS or GPS/GLONASS but cannot completely cover the conventional mainstream global satellite navigation frequencies. For the double quadrifilar helix antenna, its frequency bandwidth is much narrower than that of the quadrifilar helix antenna, and the frequency bandwidth of the double quadrifilar helix antenna in GPS L1 is only about 30 MHz, which cannot cover the mainstream satellite positioning system frequencies.

SUMMARY

In order to solve the above problems, a helical antenna is provided in an embodiment of the present disclosure, which is capable to increase the frequency bandwidth.

The helical antenna according to an embodiment of the present disclosure includes a printed circuit board and a radiation body arranged on the printed circuit board, in which the radiation body includes at least one main helical arm and at least one parasitic helical arm, each main helical arm corresponds to at least one parasitic helical arm, each main helical arm is arranged in parallel with and is spaced with its corresponding parasitic helical arm, in which, a first terminal of each main helical arm is electrically connected to a first terminal of the corresponding parasitic helical arm, to form a feed output terminal of the helical antenna;

a second terminal of the main helical arm and a second terminal of the parasitic helical arm are both in a floating state; and a length of the parasitic helical arm is greater than a length of its corresponding main helical arm, and a helix angle of a part of the parasitic helical arm exceeding its corresponding main helical arm is less than a helix angle of a part of the parasitic helical arm not exceeding its corresponding main helical arm.

In an embodiment, a side of the printed circuit board facing towards the radiation body is provided with a feed network, and a side of the printed circuit board away from the radiation body is provided with a signal processing circuit, in which, an input terminal of the feed network is electrically connected to each of feed output terminals, and an output terminal of the feed network is electrically connected to an input terminal of the signal processing circuit;

the feed network is configured to synthesize signals outputted from the feed output terminals, to obtain a circularly polarized signal; and the signal processing circuit is configured to perform a predetermined processing on the circularly polarized signal, to obtain a target signal that meets a requirement.

In an embodiment, the feed network includes a phase shifter and a balun, in which an input terminal of the phase shifter is electrically connected to each of feed output terminals, an output terminal of the phase shifter is electrically connected to an input terminal of the balun, and an output terminal of the balun is electrically connected to an input terminal of the signal processing circuit.

In an embodiment, the signal processing circuit includes a duplex filter, a low noise amplifier, a duplex combiner and a driver amplifier, in which, an input terminal of the duplex filter is electrically connected to the output terminal of the feed network, and an output terminal of the duplex filter is electrically connected to an input terminal of the low noise amplifier;

an input terminal of the duplex combiner is electrically connected to an output terminal of the low noise amplifier, and an output terminal of the duplex combiner is electrically connected to an input terminal of the driver amplifier; and an output terminal of the driver amplifier is configured to be electrically connected to a satellite positioning receiver.

In an embodiment, the printed circuit board is provided with a through hole passing through the printed circuit board along a thickness direction of the printed circuit board, and the input terminal of the duplex filter is electrically connected to the output terminal of the feed network via the through hole.

In an embodiment, a helix angle of the main helical arm ranges from 20 degrees to 25 degrees.

In an embodiment, the helical antenna further includes a flexible printed circuit board, in which the flexible printed circuit board is rolled into a cylinder, a cone or a rectangular column, and the radiation body surrounds an outer peripheral surface of the flexible printed circuit board.

In an embodiment, the radiation body is formed on the outer peripheral surface of the flexible printed circuit board by a copper plating process or a low-temperature silver baking process.

In an embodiment, the radiation body is formed by a microstrip line with a wavelength of 0.707 twining around the outer peripheral surface of the flexible printed circuit board.

In an embodiment, a thickness of the printed circuit board ranges from 0.5 mm to 2 mm.

In an embodiment, the radiation body includes four main helical arms and four parasitic helical arms.

In an embodiment, each parasitic helical arm exceeds its corresponding main helical arm by 0.2 circle to 0.4 circle.

The helical antenna according to an embodiment of the present disclosure has a radiation body including at least one main helical arm and at least one parasitic helical arm, in which each main helical arm is arranged in parallel with and is spaced with its corresponding parasitic helical arm. The main helical arm may lead to a resonance occurring at a high frequency, and the parasitic helical arm may lead to a resonance occurring at a low frequency, such that the frequency bandwidth of the helical antenna is expanded to 6%, thereby achieving an object of covering dual-frequency GPS/BDS/GLONASS satellite navigation frequency and L-Band frequency. In addition, a helix angle of a part of the parasitic helical arm exceeding its corresponding main helical arm is less than a helix angle of a part of the parasitic helical arm not exceeding its main helical arm, which can reduce a size of the helical antenna so as to make the structure of the helical antenna more compact, under a premise of ensuring necessary performance of the helical antenna.

BRIEF DESCRIPTION OF THE DRAWINGS

Other features, objects and advantages of the present disclosure will become clearer by reading the following specific descriptions of nonrestrictive embodiments made with reference to the drawings.

| 100 | Helical antenna |
|---|---|
| 110 | Printed circuit board |
| 111 | Feed network |
| 111-a | Phase shifter |
| 111-b | balun |
| 120 | Radiation body |
| 121 | Main helical arm |
| 122 | Parasitic helical arm |
| 130 | Duplex filter |
| 140 | Low noise amplifier |
| 150 | Filter |
| 160 | Duplex combiner |
| 170 | Flexible printed circuit board |
| 180 | Driver amplifier |
| 200 | Satellite positioning receiver |

DETAILED DESCRIPTION OF EMBODIMENTS

The present disclosure is described in detail below in conjunction with the drawings and embodiments. It is understandable that specific embodiments described herein are used to simply explain the present disclosure, but not to limit the present disclosure. It also should be noted that for easy of description, the drawings merely show the related parts to the present disclosure.

It should be noted that embodiments of the present disclosure and features in the embodiments may be in combination with each other as long as there is no conflict. The helical antenna according to the embodiments of the present disclosure will be described in detail below with reference to the drawings and in conjunction with the embodiments.

Figure 1:
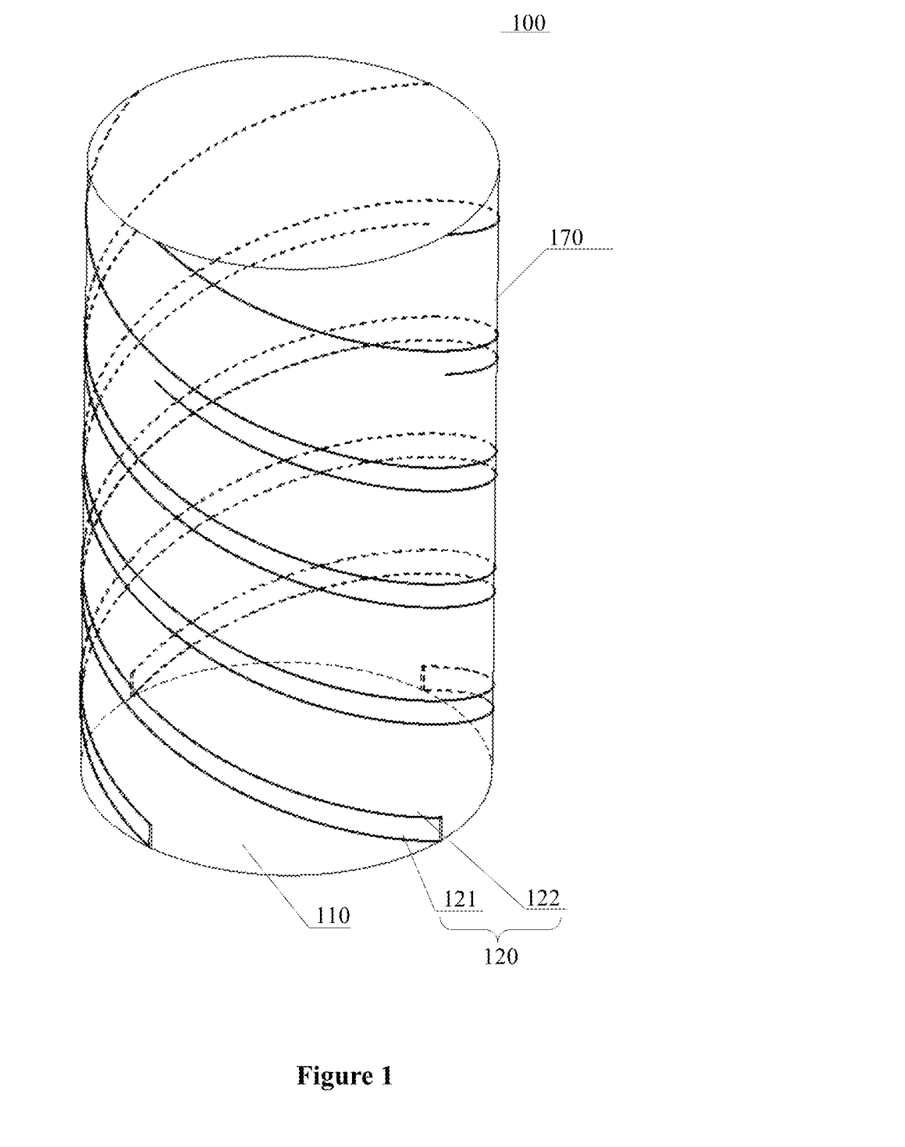
FIG. 1 is a structural schematic diagram of a helical antenna according to a first embodiment of the present disclosure.
Figure 2:
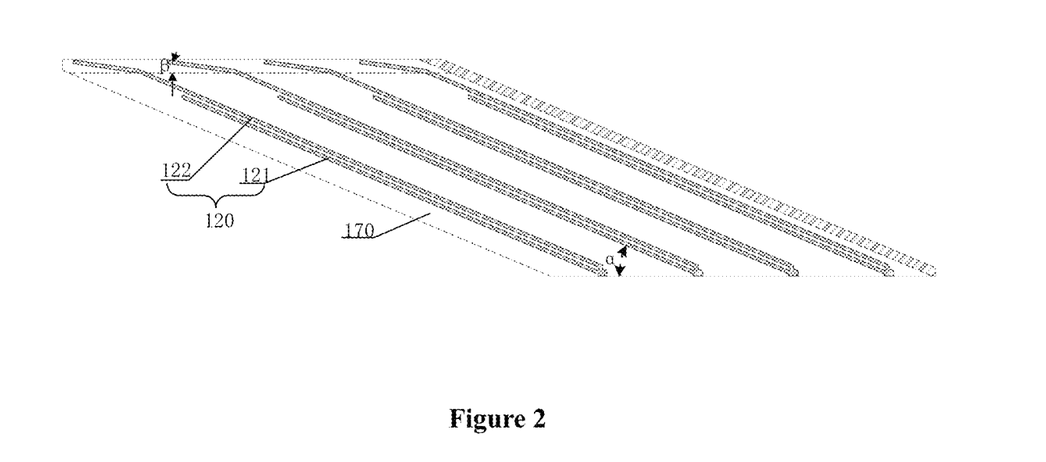
FIG. 2 is a structural schematic diagram of a radiation body in a flattened state according to a second embodiment of the present disclosure.

As shown in FIG. 1 and FIG. 2, a helical antenna 100 is provided in an embodiment of the present disclosure. The helical antenna 100 includes a printed circuit board 110 and a radiation body 120 arranged on the printed circuit board 110. The radiation body 120 includes at least one main helical arm 121 and at least one parasitic helical arm 122, in which each main helical arm 121 corresponds to at least one parasitic helical arm 122, and each main helical arm 121 is arranged in parallel with and is spaced with its corresponding parasitic helical arm 122.

A first terminal of each main helical arm 121 is electrically connected to a first terminal of its corresponding parasitic helical arm 122, to form a feed output terminal OUT of the helical antenna 100. A second terminal of each main helical arm 121 and a second terminal of the parasitic helical arm 122 are both in a floating state.

Here it should be noted that the floating state refers to that the second terminal of the main helical arm 121 and the second terminal of the parasitic helical arm 122 are both in an open circuit state.

In some embodiments, as shown in FIG. 2, a length of the parasitic helical arm 122 is greater than a length of its corresponding main helical arm 121. A helix angle β of a part of the parasitic helical arm 122 exceeding its corresponding main helical arm 121 is less than a helix angle α of a part of the parasitic helical arm 122 not exceeding its corresponding main helical arm 121, which is capable to reduce a size of the helical antenna 100 so as to make a structure of the helical antenna 100 more compact, under a premise of ensuring necessary performance of the helical antenna 100.

In a specific example, as shown in FIG. 1, the radiation body 120 of the helical antenna 100 may include four main helical arms 121 and four parasitic helical arms 122. In practice, other numbers of main helical arms 121 and parasitic helical arms 122 may also be selected according to actual requirements.

In a case that the radiation body 120 include four main helical arms 121 and four parasitic helical arms 122, a first terminal (which is the terminal close to the printed circuit board 110 shown in FIG. 1) of each of the four main helical arms 121 is electrically connected to a first terminal (which is the terminal close to the printed circuit board 110 shown in FIG. 1) of its corresponding parasitic helical arm 122. In a specific embodiment, the first terminal of the main helical arm 121 may be electrically connected to the first terminal of the parasitic helical arm 122 via a metal connection part. Alternatively, the first terminal of the main helical arm 121 may also be electrically connected to the first terminal of the parasitic helical arm 122 in other electrical connection manner. Second terminals of the four main helical arms 121 and second terminals of the four parasitic helical arms 122 are all in the open circuit state (that is, in the floating states). Moreover, as shown in FIG. 2, a helix angle β of a top part of the parasitic helical arm 122 is less than a helix angle α of a bottom part of the parasitic helical arm 122.

In an embodiment, as shown in FIG. 2, a helix angle α of the above main helical arm 121 may range from 20 degrees to 25 degrees. Accordingly, a helix angle α of a part of the parasitic helical arm 122 not exceeding its corresponding main helical arm 121 may also range from 20 degrees to 25 degrees. A helix angle β of a part of the parasitic helical arm 122 exceeding its corresponding main helical arm 121 may range from 6 degrees to 10 degrees.

In an embodiment, as shown in FIG. 1 and FIG. 2, the helical antenna 100 may further include a flexible printed circuit board 170. The flexible printed circuit board 170 is rolled into a cylinder, a cone or a rectangular column, and the radiation body 120 surrounds an outer peripheral surface of the flexible printed circuit board 170.

Specifically, the radiation body 120 may be formed on the outer peripheral surface of the flexible printed circuit board 170 by a copper plating process or a low-temperature silver baking process.

In addition, the radiation body 120 may be formed by a microstrip line of 0.707 wavelength twining around the outer peripheral surface of the flexible printed circuit board 170.

Specifically, the flexible printed circuit board 170 may be a polytetrafluoroethylene board. In practice, a microstrip line may be arranged on the flexible printed circuit board 170 based on a specific helix angle and a length. Then the microstrip line is rolled into a helix line, to form the radiation body 120.

In an embodiment, the main helical arm 121 of the radiation body 120 twines around the outer peripheral surface of the flexible printed circuit board 170 for 1 circle. The parasitic helical arm 122 of the radiation body 120 twines around the outer peripheral surface of the flexible printed circuit board 170 for 1.3 circles. The In an embodiment, as shown in FIG. 1 and FIG. 2, each parasitic helical arm 122 may exceed its corresponding main helical arm 121 by 0.2 circle to 0.4 circle, preferably 0.3 circle.

The helical antenna 100 according to an embodiment of the present disclosure has a radiation body 120 including at least one main helical arm 121 and at least one parasitic helical arm 122, in which each main helical arm 121 is arranged in parallel with and is spaced with its corresponding parasitic helical arm 122. The main helical arm 121 may lead to a resonance occurring at a high frequency, and the parasitic helical arm 122 may lead to a resonance occurring at a low frequency, such that the frequency bandwidth of the helical antenna 100 is expanded to 6%, thereby achieving an object of covering dual-frequency GPS/BDS/GLONASS satellite navigation frequency and L-Band frequency. In some embodiments, a helix angle of a part of the parasitic helical arm 122 exceeding its corresponding main helical arm 121 is less than a helix angle of a part of the parasitic helical arm 122 not exceeding its main helical arm 121, which can reduce a size of the helical antenna 100 so as to make the structure of the helical antenna 100 more compact, under a premise of ensuring necessary performance of the helical antenna 100.

Figure 3:
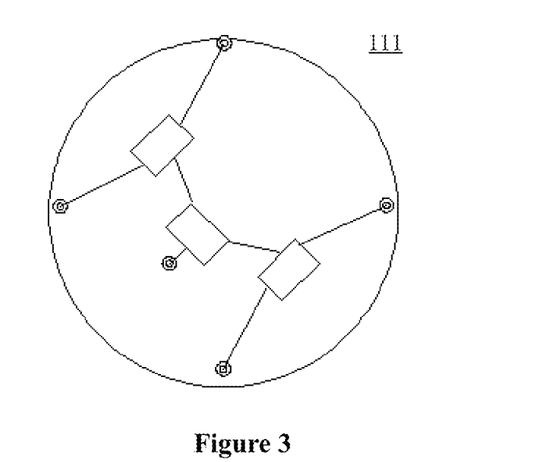
FIG. 3 is a structural schematic diagram of a feed network according to a third embodiment of the present disclosure.

In some implementations of the embodiment of the present disclosure, as shown in FIG. 1 and FIG. 3, a side of the printed circuit board 110 facing towards the radiation body 120 is provided with a feed network 111. Moreover, the side (that is the side facing towards the radiation body 120) of the printed circuit board 110 may be a ground plane, to form a reflection surface of the helical antenna 100. The printed circuit board 110 may be a FR-4 multilayer board, and a thickness of the printed circuit board 110 may range from 0.5 mm to 2 mm. A side of the printed circuit board 110 away from the radiation body 120 is provided with a signal processing circuit. An input terminal of the feed network 111 is electrically connected to each feed output terminal OUT, and an output terminal of the feed network 111 is electrically connected to an input terminal of the signal processing circuit. The feed network 111 is configured to synthesize signals outputted from the feed output terminals OUT, to obtain a circularly polarized signal.

Figure 4:
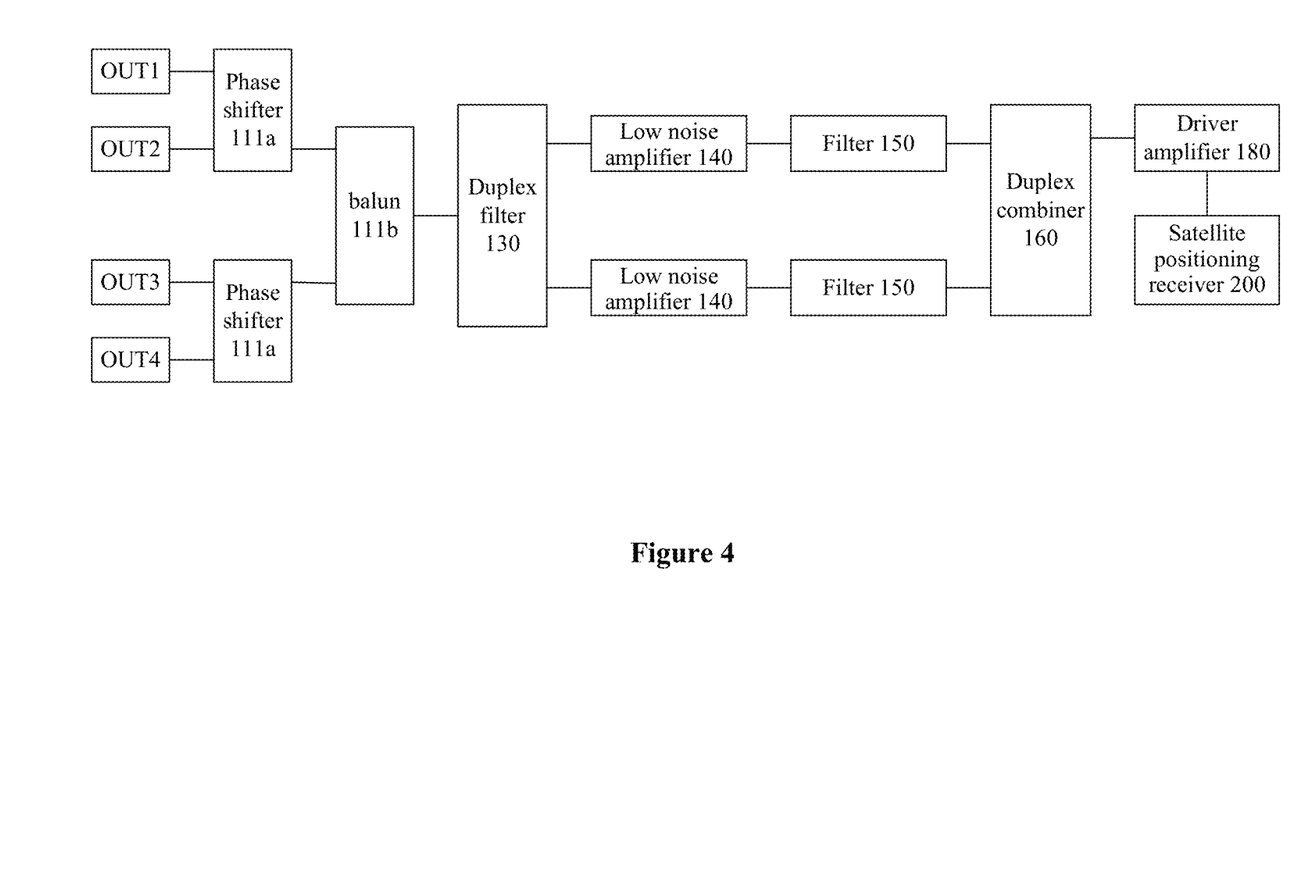
FIG. 4 is a circuit principle structural diagram of a helical antenna according to a fourth embodiment of the present disclosure.

Specifically, as shown in FIG. 3 and FIG. 4, the feed network 111 may include two phase shifters 111a (the phase shifter 111a may be a 90 degree phase shifter) and one balun 111b (the balun 111b may be a 180 degree balun). In a case that the radiation body 120 includes four main helical arms 121 and four parasitic helical arms 122, an input terminal of one of the two phase shifters 111a may be electrically connected to two feed output terminals OUT1 and OUT2, and an input terminal of the other phase shifter 111a may be electrically connected to the other two feed output terminals OUT3 and OUT4. Moreover, output terminals of the two phase shifters 111a are electrically connected to an input terminal of the balun 111b, and an output terminal of the balun 111b is electrically connected to an input terminal of the signal processing circuit.

Specifically, in an example, as shown in FIG. 4, the signal processing circuit may include a duplex filter 130, a low noise amplifier 140, a duplex combiner 160 and a driver amplifier 180. An input terminal of the duplex filter 130 is electrically connected to the output terminal of the balun 111b, and an output terminal of the duplex filter 130 is electrically connected to an input terminal of the low noise amplifier 140. An input terminal of the duplex combiner 160 is electrically connected (directly or via a filter 150) to an output terminal of the low noise amplifier 140, and an output terminal of the duplex combiner 160 is electrically connected to an input terminal of the driver amplifier 180. An output terminal of the driver amplifier 180 is configured to be electrically connected to a satellite positioning receiver 200.

In practice, in order to realize electrical connection between the feed network 111 and the signal processing circuit on the printed circuit board 110, the printed circuit board 110 may be provided with a through hole (not shown) passing through the printed circuit board 110 along a thickness direction of the printed circuit board 110. In this way, the input terminal of the duplex filter 130 can be electrically connected to the output terminal of the feed network 111 via the through hole.

A specific signal transmission process of the helical antenna 100 is described below, in which the helical antenna 100 includes four main helical arms 121 and four parasitic helical arms 122 is taken as an example.

Specifically, as shown in FIG. 1, FIG. 3 and FIG. 4, the four main helical arms 121 and the four parasitic helical arms 122 form four feed output terminals OUT1, OUT2, OUT3 and OUT4. The four feed output terminals OUT1, OUT2, OUT3 and OUT4 are welded to the printed circuit board 110, so as to transmit signals to the feed network 111 on the printed circuit board 110 in a coupling manner. The feed network 111 synthesizes orthogonal signals to obtain a circularly polarized signal, and the circularly polarized signal is transmitted to the signal processing circuit at bottom via the through hole of the printed circuit board 110. Then the duplex filter 130 filters out a high frequency signal and a low frequency signal. The low noise amplifier 140 amplifies satellite navigation signals received in the two frequency bands. Then secondary filtering is performed on the amplified signals by the filter 150, and the filtered signals are synthesized by the duplex combiner 160. Then the synthesized signal is amplified by the driver amplifier 180, to obtain a target signal that meets requirements. Then the target signal is transmitted to the satellite positioning receiver 200 through a cable.

Figure 5:
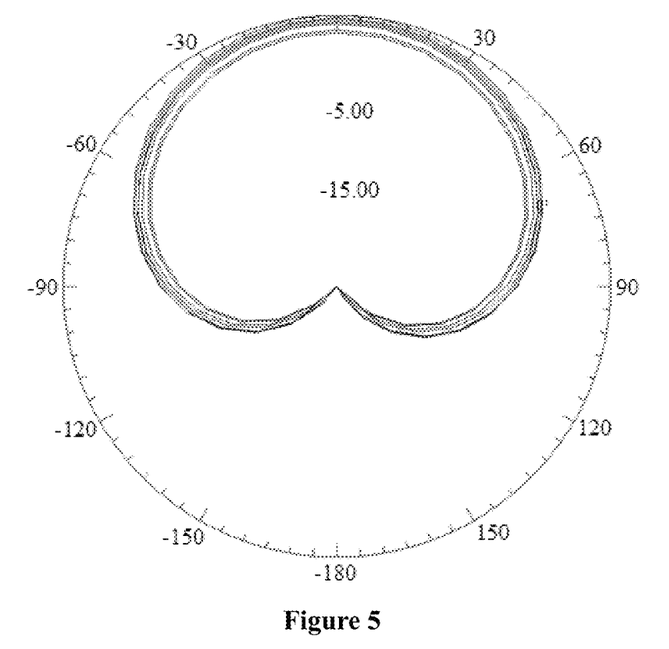
FIG. 5 is a radiation pattern of a helical antenna at a high frequency according to a fifth embodiment of the present disclosure.
Figure 6:
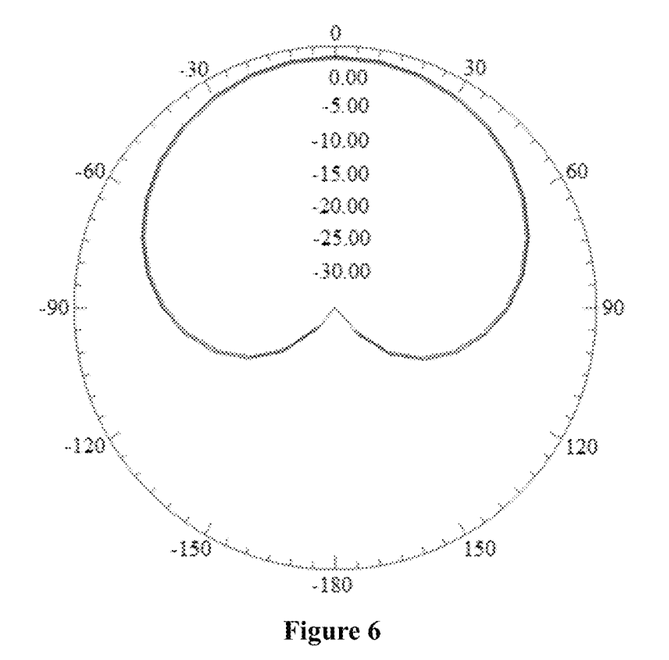
FIG. 6 is a radiation pattern of a helical antenna at a low frequency according to a sixth embodiment of the present disclosure.
Figure 7:
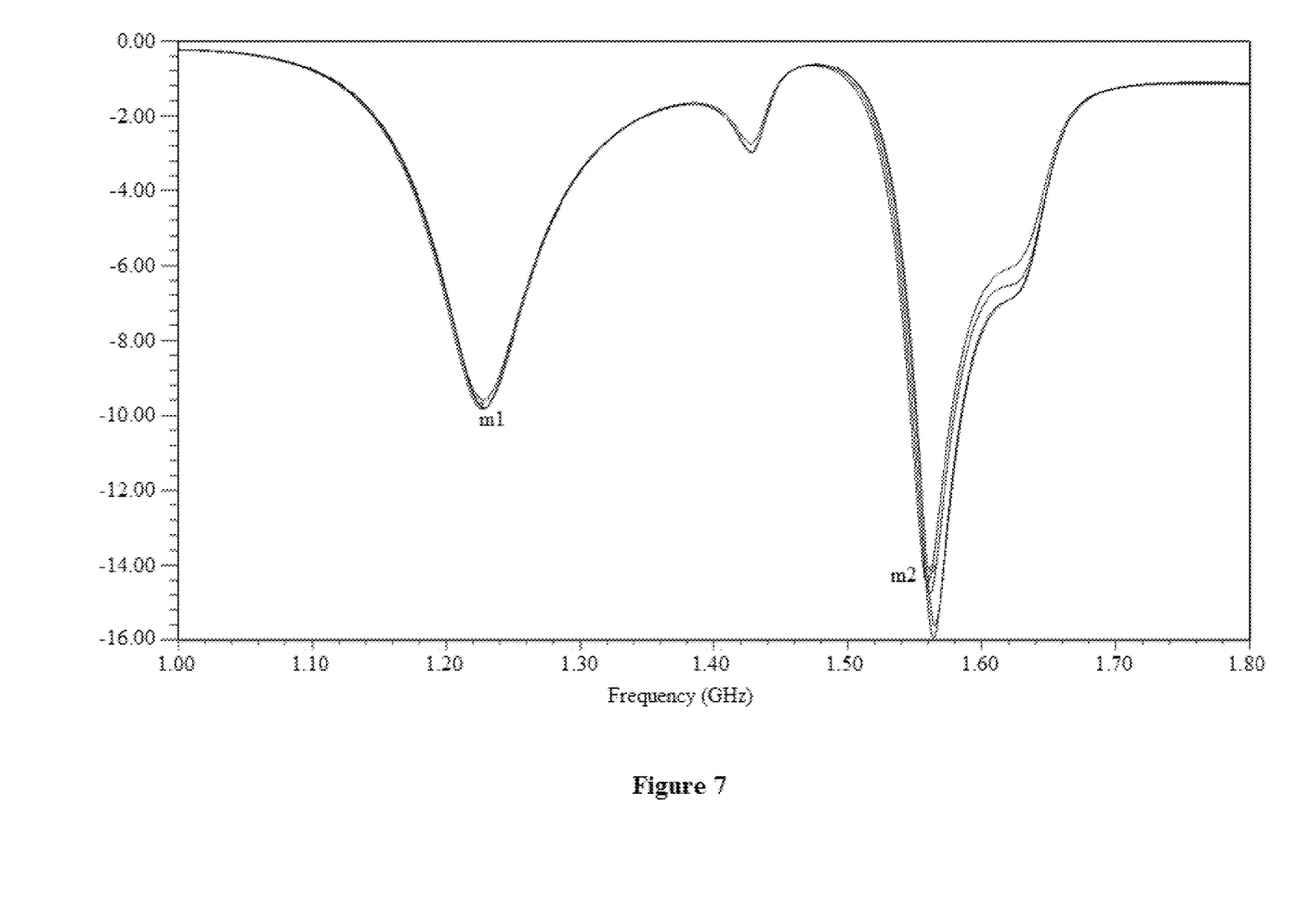
FIG. 7 is a schematic diagram of S parameters of a feed point of a helical antenna according to a seventh embodiment of the present disclosure.
Figure 8:
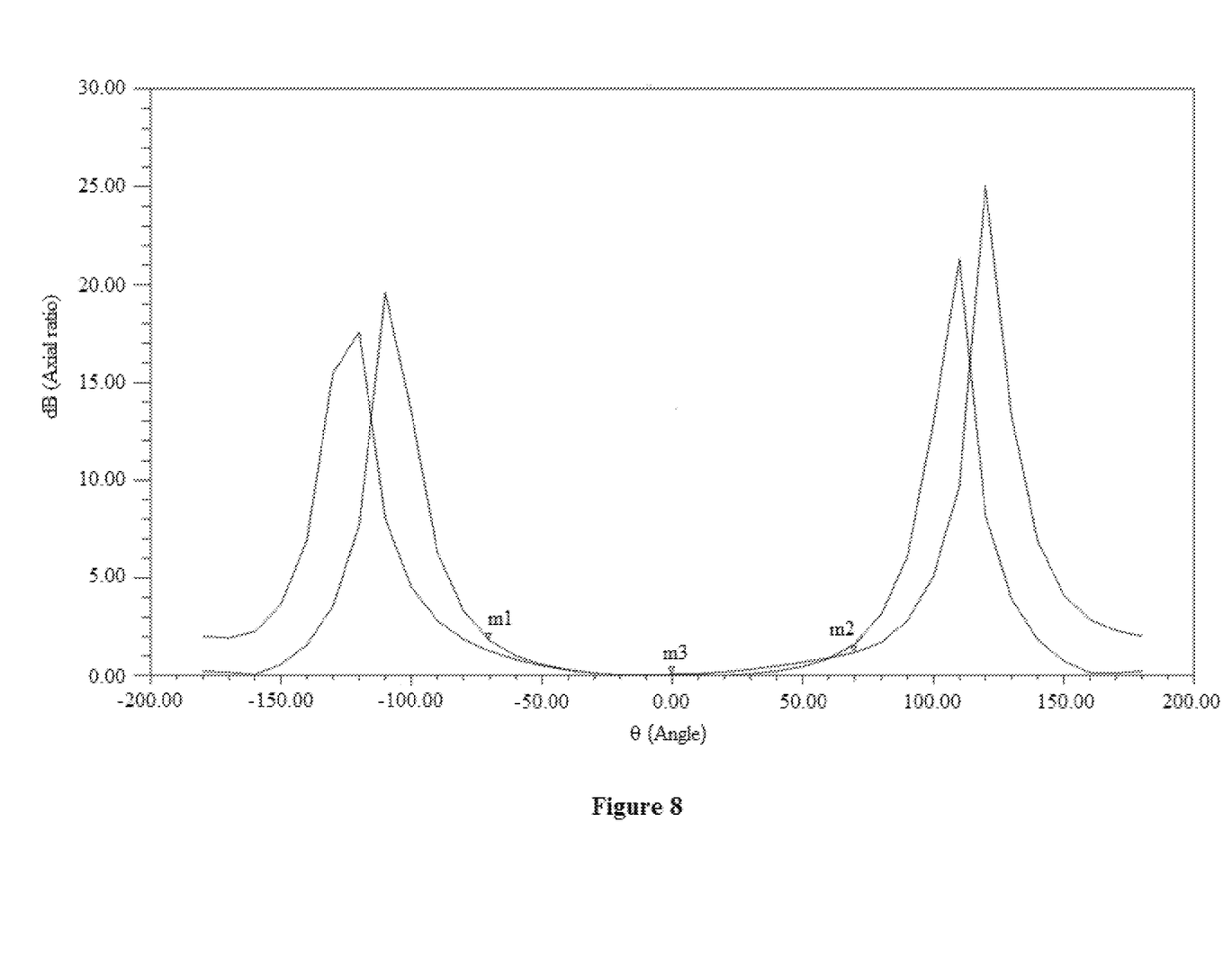
FIG. 8 is a schematic diagram of a polarization axial ratio of a helical antenna according to an eighth embodiment of the present disclosure.

As shown in FIG. 5 and FIG. 6, the helical antenna 100 according to the embodiment of the present disclosure has a maximum gain exceeding 3 dBi at the dual-frequency GPS/BDS/GLONASS satellite navigation frequency and L-Band, and has a gain of −1.2 dBi at 20 degree low elevation. As shown in FIG. 7, a reflection of the feed output terminal is greater than 9 dB, which meets demands for a helical antenna. As shown in FIG. 8, a polarization axial ratio of the helical antenna is 0.07 dB and a low elevation is less than 2 dB, which reaches conventional technical levels. In addition, the helical antenna 100 according to the present disclosure can further effectively reduce a size of the helical antenna 100, so as to make a structure of the helical antenna 100 more compact.

The above descriptions are merely preferred embodiments of the present disclosure and explanations of technical principles used. Those skilled in the art should understand that the protection scope of the present disclosure is not limited to technical solutions formed by a specific combination of the above technical features, but includes other technical solution formed by any combination of the above technical features or equivalent features thereof without departing from an inventive concept of the present disclosure, for example, a technical solution by interchanging the above features and technical features having similar functions disclosed in the present disclosure (but is not limited to the present disclosure) with each other.

The invention claimed is:

1. A helical antenna, comprising a printed circuit board and a radiation body arranged on the printed circuit board, wherein the radiation body comprises at least one main helical arm and at least one parasitic helical arm, each main helical arm corresponds to at least one parasitic helical arm, each main helical arm is arranged in parallel with and is spaced with its corresponding parasitic helical arm, wherein,
   a first terminal of each main helical arm is electrically connected to a first terminal of the corresponding parasitic helical arm, to form a feed output terminal of the helical antenna;
   a second terminal of the main helical arm and a second terminal of the parasitic helical arm are both in a floating state; and
   a length of the parasitic helical arm is greater than a length of its corresponding main helical arm, and a helix angle of a part of the parasitic helical arm exceeding its corresponding main helical arm at the second terminal of the parasitic helical arm in the floating state is less than a helix angle of a part of the parasitic helical arm not exceeding its corresponding main helical arm.

2. The helical antenna according to claim 1, wherein a side of the printed circuit board facing towards the radiation body is provided with a feed network, and a side of the printed circuit board away from the radiation body is provided with a signal processing circuit, wherein,
   an input terminal of the feed network is electrically connected to each of feed output terminals, and an output terminal of the feed network is electrically connected to an input terminal of the signal processing circuit;
   the feed network is configured to synthesize signals outputted from the feed output terminals, to obtain a circularly polarized signal; and
   the signal processing circuit is configured to perform a predetermined processing on the circularly polarized signal, to obtain a target signal that meets a requirement.

3. The helical antenna according to claim 2, wherein the feed network comprises a phase shifter and a balun;
   an input terminal of the phase shifter is electrically connected to each of feed output terminals, an output terminal of the phase shifter is electrically connected to an input terminal of the balun, and an output terminal of the balun is electrically connected to an input terminal of the signal processing circuit.

4. The helical antenna according to claim 2, wherein the signal processing circuit comprises a duplex filter, a low noise amplifier, a duplex combiner and a driver amplifier, wherein,
   an input terminal of the duplex filter is electrically connected to the output terminal of the feed network, and an output terminal of the duplex filter is electrically connected to an input terminal of the low noise amplifier;
   an input terminal of the duplex combiner is electrically connected to an output terminal of the low noise amplifier, and an output terminal of the duplex combiner is electrically connected to an input terminal of the driver amplifier; and
   an output terminal of the driver amplifier is configured to be electrically connected to a satellite positioning receiver.

5. The helical antenna according to claim 4, wherein the printed circuit board is provided with a through hole passing through the printed circuit board along a thickness direction of the printed circuit board, and the input terminal of the duplex filter is electrically connected to the output terminal of the feed network via the through hole.

6. The helical antenna according to claim 1, wherein a helix angle of the main helical arm ranges from 20 degrees to 25 degrees.

7. The helical antenna according to claim 1, further comprising a flexible printed circuit board, wherein the flexible printed circuit board is rolled into a cylinder, a cone or a rectangular column, and the radiation body surrounds an outer peripheral surface of the flexible printed circuit board.

8. The helical antenna according to claim 7, wherein the radiation body is formed on the outer peripheral surface of the flexible printed circuit board by a copper plating process or a low-temperature silver baking process.

9. The helical antenna according to claim 1, wherein the radiation body is a micro strip line with a wavelength of 0.707.

10. The helical antenna according to claim 1, wherein a thickness of the printed circuit board ranges from 0.5 mm to 2 mm.

11. The helical antenna according to claim 1, wherein the radiation body comprises four main helical arms and four parasitic helical arms.

12. The helical antenna according to claim 1, wherein each parasitic helical arm exceeds its corresponding main helical arm by 0.2 circle to 0.4 circle.

* * * * *